United States Patent
Lee et al.

(10) Patent No.: US 10,236,035 B1
(45) Date of Patent: Mar. 19, 2019

(54) DRAM MEMORY DEVICE ADJUSTABLE REFRESH RATE METHOD TO ALLEVIATE EFFECTS OF ROW HAMMER EVENTS

(71) Applicant: NANYA TECHNOLOGY CORPORATION, New Taipei (TW)

(72) Inventors: Chung-Hsun Lee, New Taipei (TW); Hsien-Wen Liu, Taoyuan County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/840,083

(22) Filed: Dec. 13, 2017

Related U.S. Application Data

(60) Provisional application No. 62/594,128, filed on Dec. 4, 2017.

(51) Int. Cl.
*G11C 7/00* (2006.01)
*G11C 11/4076* (2006.01)
*G11C 11/406* (2006.01)

(52) U.S. Cl.
CPC ............ *G11C 7/00* (2013.01); *G11C 11/4076* (2013.01); *G11C 11/40615* (2013.01)

(58) Field of Classification Search
CPC .................. G11C 11/40615; G11C 11/4076
See application file for complete search history.

(56) References Cited

U.S. PATENT DOCUMENTS

| 9,741,422 | B1* | 8/2017 | Park | ................ G11C 11/40618 |
| 2009/0161459 | A1* | 6/2009 | Kohler | ................ G11C 11/406 365/201 |
| 2010/0208537 | A1* | 8/2010 | Pelley, III | ............ G11C 11/406 365/201 |
| 2014/0085995 | A1* | 3/2014 | Greenfield | ............... G11C 7/24 365/201 |

* cited by examiner

*Primary Examiner* — Ajay Ojha
(74) *Attorney, Agent, or Firm* — Muncy, Geissler, Olds & Lowe, P.C.

(57) ABSTRACT

The present disclosure provides a dynamic random access memory (DRAM). The DRAM includes a refresh unit, an accessing device and a refresh device. The refresh unit has a plurality of memory rows. The accessing device is configured to access the memory rows. The refresh device is configured to refresh the refresh unit in a first manner in response to a first event, in which a quantity of accessed memory rows of the refresh unit is not greater than a threshold quantity. The refresh device is configured to refresh the refresh unit in a second manner in response to a second event, in which the quantity of accessed memory rows of the refresh unit is greater than the threshold quantity.

14 Claims, 16 Drawing Sheets

DRAM MEMORY DEVICE ADJUSTABLE REFRESH RATE METHOD TO ALLEVIATE EFFECTS OF ROW HAMMER EVENTS

PRIORITY CLAIM AND CROSS-REFERENCE

This application claims the benefit of provisional application Ser. 62/594,128 filed on Dec. 4, 2017, entitled "DRAM" the disclosure of which is hereby incorporated by reference in its entirety.

TECHNICAL FIELD

The present disclosure relates to a dynamic random access memory (DRAM), and more particularly, to management of a refresh operation on a DRAM.

DISCUSSION OF THE BACKGROUND

Dynamic random access memory (DRAM) is a type of random access memory that stores each bit of data in a separate capacitor. A simplest DRAM cell comprises a single N-type metal-oxide-semiconductor (NMOS) transistor and a single capacitor. If charge is stored in the capacitor, the cell is said to store a logic HIGH, depending on the convention used. If no charge is present, the cell is said to store a logic LOW. Because the charge in the capacitor dissipates over time, DRAM systems require additional refreshing circuitries to periodically refresh the charge stored in the capacitors. Since a capacitor can store only a very limited amount of charge, in order to quickly distinguish the difference between a logic HIGH and a logic LOW, two bit lines (BLs) are typically used for each bit, wherein the first bit line in the bit line pair is known as a bit line true (BLT) and the other bit line in the bit line pair is the bit line complement (BLC). The single NMOS transistor's gate is controlled by a word line (WL).

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a DRAM. The DRAM includes a refresh unit, an accessing device and a refresh device. The refresh unit has a plurality of memory rows. The accessing device is configured to access the memory rows. The refresh device is configured to refresh the refresh unit in a first manner in response to a first event, in which a quantity of accessed memory rows of the refresh unit is not greater than a threshold quantity. The refresh device is configured to refresh the refresh unit in a second manner in response to a second event, in which the quantity of accessed memory rows of the refresh unit is greater than the threshold quantity.

In some embodiments, the refresh device is configured to, in response to the first event, refresh the refresh unit according to a first refresh rate, except for a neighbor memory row of the refresh unit, wherein the neighbor memory row is one of all of unaccessed memory rows of the refresh unit, and the neighbor memory row is immediately adjacent to an accessed memory row of the refresh unit.

In some embodiments, the refresh device is configured to, in response to the first event, refresh the neighbor memory row according to a second refresh rate greater than the first refresh rate.

In some embodiments, the DRAM further includes a control device configured to identify, from among the all of unaccessed memory rows, the neighbor memory row.

In some embodiments, the refresh device is configured to, in response to the second event, refresh the refresh unit according to a first refresh rate, except for the all of unaccessed memory rows.

In some embodiments, the refresh device is configured to, in response to the second event, refresh the all of unaccessed memory rows according to a second refresh rate greater than the first refresh rate.

Another aspect of the present disclosure provides a DRAM. The DRAM includes a refresh unit, an accessing device, a first refresh device and a second refresh device. The accessing device is configured to access the refresh unit having a plurality of memory rows. The first refresh device is configured to refresh the refresh unit. The second refresh device is configured to refresh a neighbor memory row of the refresh unit in response to a first event, in which an access time of the refresh unit reaches a threshold number of times within a self-refresh cycle and a quantity of accessed memory rows of the refresh unit is not greater than a first threshold quantity, wherein the neighbor memory row is one of all of unaccessed memory rows of the refresh unit and immediately adjacent to an accessed memory row of the refresh unit.

In some embodiments, the DRAM further includes a control device configured to identify, from among the all of unaccessed memory rows, the neighbor memory row.

In some embodiments, the second refresh device is configured to refresh the all of unaccessed memory rows in response to a second event, in which the access time of the refresh unit reaches the threshold number of times within the self-refresh cycle and the quantity of accessed memory rows is greater than the first threshold quantity.

In some embodiments, the first refresh device is configured to not refresh the refresh unit within the self-refresh cycle in response to a third event, in which the access time of the refresh unit reaches the threshold number of times within the self-refresh cycle and the quantity of accessed memory rows is equal to or greater than a second threshold quantity which is greater than the first threshold quantity.

In some embodiments, the DRAM further includes a controller configured to generate the access time of the refresh unit by counting, control the second refresh device to refresh the all of unaccessed memory rows when the count indicates the second event, and control the second refresh device to refresh the neighbor memory row when the count indicates the first event.

Another aspect of the present disclosure provides a DRAM. The DRAM includes a refresh unit, an accessing device, a first refresh device and a second refresh device. The accessing device is configured to access the refresh unit having a plurality of memory rows. The first refresh device is configured to refresh the refresh unit according to a first refresh rate. The second refresh device is configured to be activated in response to an event in which an access time of the refresh unit reaches a threshold number of times within a self-refresh cycle, and to refresh unaccessed memory rows of the refresh unit according to a second refresh rate when being activated.

In some embodiments, the second refresh device is activated. The second refresh device is further configured to refresh a neighbor memory row of the refresh unit in response to a first event, in which a quantity of accessed memory rows of the refresh unit is not greater than a first threshold quantity.

In some embodiments, the neighbor memory row is one of all of unaccessed memory rows of the refresh unit, and the neighbor memory row is immediately adjacent to an accessed memory row of the refresh unit.

In some embodiments, the second refresh device is activated. The second refresh device is configured to refresh the all of unaccessed memory rows in response to a second event, in which the quantity of accessed memory rows is greater than a first threshold quantity.

In some embodiments, the first refresh device is configured to not refresh the refresh unit within a self-refresh cycle in response to a third event, in which the quantity of accessed memory rows is equal to or greater than a second threshold quantity which is greater than the first threshold quantity.

In the present disclosure, when the refresh unit is accessed the threshold number of times, for example, 5,000,000 times, which is very high, the refresh unit is refreshed. In addition, the refresh unit can be refreshed in a variety of different ways, depending on different access circumstances of the refresh unit. As a result, the refresh operation is relatively versatile.

In some existing DRAMs, when a refresh unit of the DRAM is accessed, for example, 5,000,000 times, the refresh unit is refreshed in only a single way. For example, all memory rows of the refresh unit are refreshed according to the same refresh rate. As a result, such DRAM is relatively not versatile.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description.

DETAILED DESCRIPTION

Figure 1:
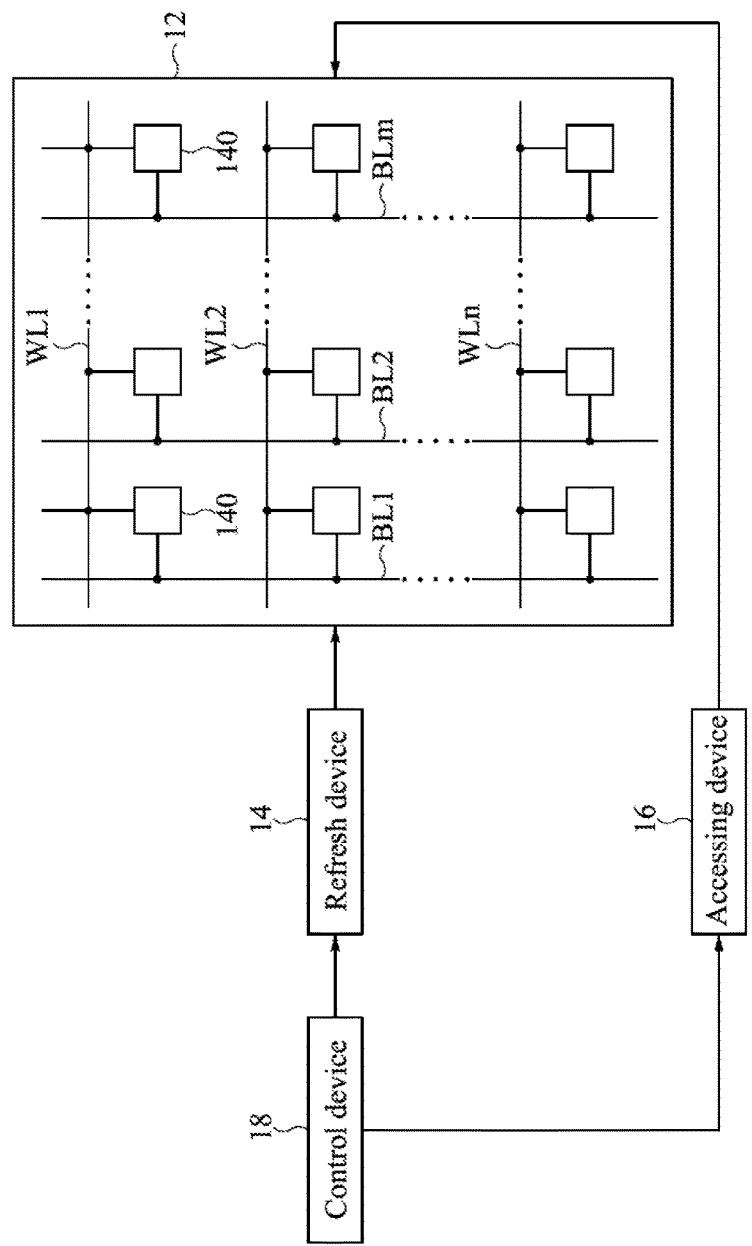
FIG. 1 is a schematic diagram of a dynamic random access memory (DRAM), in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a dynamic random access memory (DRAM) 10, in accordance with some embodiments of the present disclosure. Referring to FIG. 1, the DRAM 10 includes a storage area 12, a refresh device 14, an accessing device 16 and a control device 18.

The storage area 12 includes a plurality of memory cells 140 arranged in a two-dimensional array. The memory cell 140 functions to store data. The memory cells 140 in the same row can be designated as a memory row, and can be illustrated with a block for convenience. In addition to the memory cells 140, the storage area 12 further includes a plurality of word lines WL1 to WLn and a plurality of bit lines BL1 to BLm, wherein n and m are positive integers. The word lines WL1 to WLn and the bit lines BL1 to BLm are used to control operation of the associated memory cells 140.

The refresh device 14 functions to refresh a memory row in a fashion in which, for example, a charge is read from the memory cell 140 of the memory row, and, subsequently, the same charge is immediately written back to the memory cell 140. However, the present disclosure is not limited thereto. The refresh device 14 may refresh the memory row in another alternative fashion.

The accessing device 16 functions to access a memory row. For example, the accessing device 16 may read data from, or write data to, the memory cell 140 of the memory row.

The control device 18 functions to control the refresh device 14 based on an access circumstance of the memory cells 140. As a result, the control device 18 is able to manage a refresh operation of the refresh device 14. The refresh operation is relatively versatile, as will be seen in the detailed description below.

Figure 2:
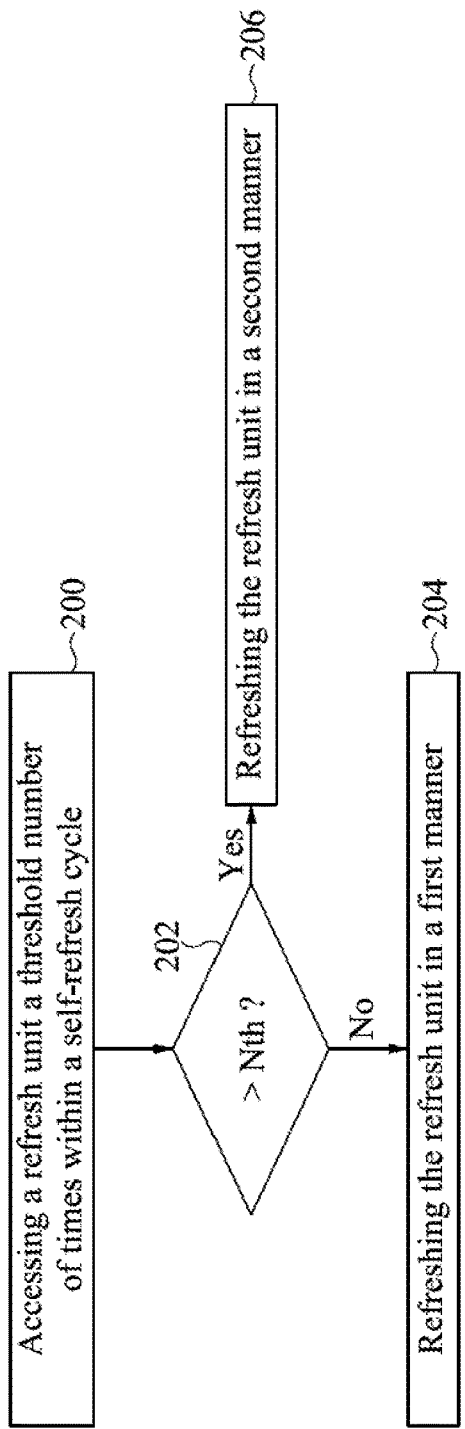
FIG. 2 is a flow diagram of a method of operating a DRAM, in accordance with some embodiments of the present disclosure.

FIG. 2 is a flow diagram of a method 20 of operating a DRAM, in accordance with some embodiments of the present disclosure. Referring to FIG. 2, the method 20 includes operations 200, 202, 204 and 206.

The method 20 begins with operation 200, in which a refresh unit is accessed a threshold number of times within a self-refresh cycle.

The method 20 proceeds to operation 202, in which it is determined whether a quantity of accessed memory rows of the refresh unit is greater than a threshold quantity. If negative, the method 20 proceeds to operation 204. In operation 204, the refresh unit is refreshed in a first manner. If affirmative, the method 20 proceeds to operation 206, in which the refresh unit is refreshed in a second manner different from the first manner.

The method 20 is merely an example, and is not intended to limit the present disclosure beyond what is explicitly recited in the claims. Additional operations can be provided before, during, and after the method 20, and some operations described can be replaced, eliminated, or moved around for additional embodiments of the method.

In the present embodiment, when a refresh unit is accessed a threshold number of times, for example, 5,000,000 times, which is very high, the refresh unit is refreshed. In addition, the refresh unit can be refreshed in a variety of different ways, depending on different access circumstances of the refresh unit. As a result, the refresh operation is relatively versatile.

In some existing approaches, when a refresh unit is accessed, for example, 5,000,000 times, the refresh unit is refreshed in only a single way. For example, all of memory rows of the refresh unit is refreshed according to the same refresh rate. As a result, such approach is relatively not versatile.

Figure 3:
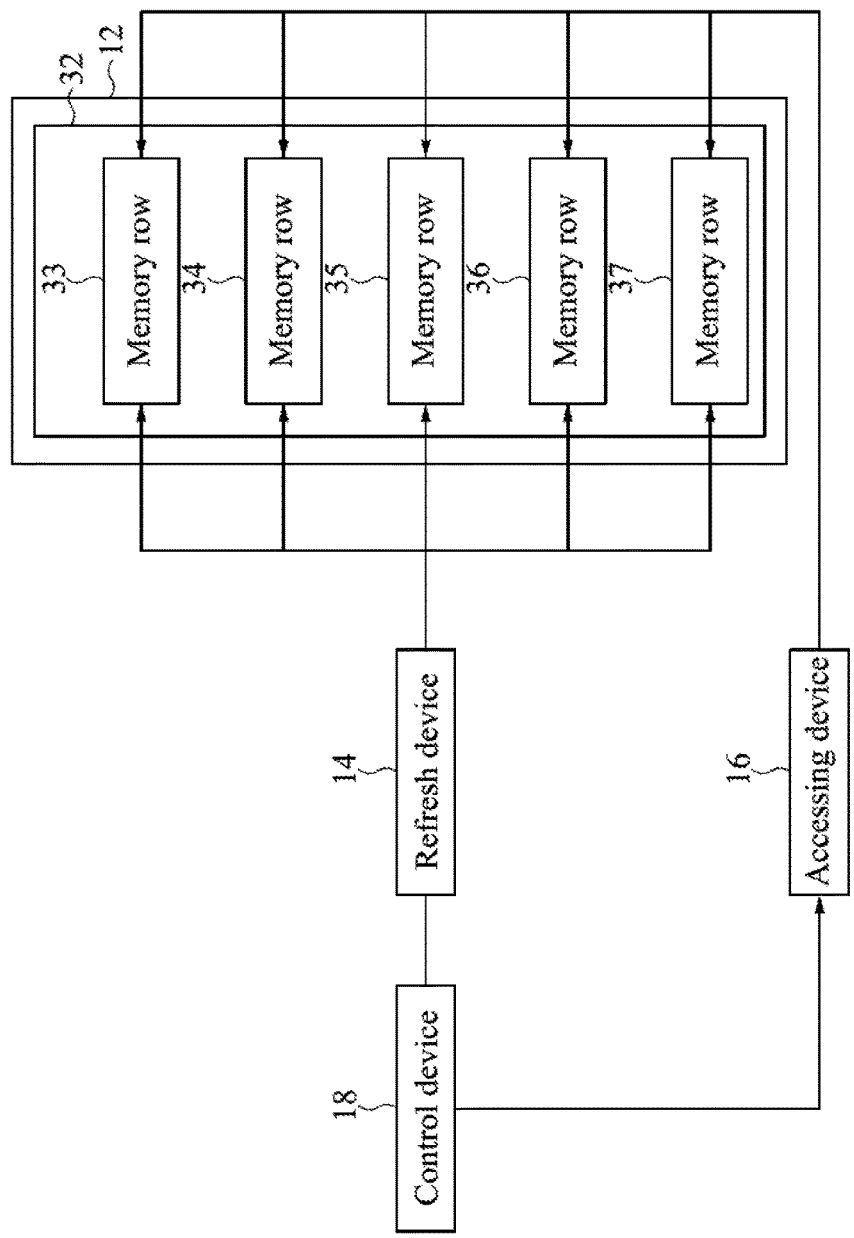
FIG. 3 is a schematic diagram of the DRAM shown in FIG. 1 including a refresh unit, in accordance with some embodiments of the present disclosure.

FIG. 3 is a schematic diagram of the DRAM 10 shown in FIG. 1 including a refresh unit 32, in accordance with some embodiments of the present disclosure. Referring to FIG. 3, the storage area 12 includes the refresh unit 32 including memory rows 33, 34, 35, 36 and 37.

In some embodiments, the memory rows 33, 34, 35, 36 and 37 of the refresh unit 32 belong to a single bank. In some embodiments, the memory rows 33, 34, 35, 36 and 37 may belong to different banks. That is, the refresh unit 32 may include a single bank, or a plurality of banks. The present disclosure is not limited to any specific type.

In the present embodiment, a threshold number of times indicates the point at which the refresh unit 32 becomes subject to a row hammer effect. That is, the refresh unit 32 is subject to a row hammer effect when the accessing device 16 accesses the refresh unit 32 the threshold number of times within a self-refresh cycle. In further detail, when the memory row 34 of the refresh unit 32 has been accessed more than, for example, about 300,000 times in a given period such as within a self-refresh cycle, the memory row 34 is subject to a row hammer effect, i.e. a row hammer effect may occur. To facilitate a better understanding of a row hammer effect, assume that the memory cells 140 of the memory rows 33 and 35 have a logic HIGH. The memory rows 33 and 35 are immediately adjacent to the memory row 34. If the memory row 34 is accessed more than, for example, about 300,000 times in a given period, data stored by the memory rows 33 and 35 may be flipped from a logic HIGH to a logic LOW without accessing the memory rows 33 and 35. Such scenario is called a row hammer effect. Since such flip is not intended, such flip may lead to the DRAM 10 working abnormally, or providing the wrong data.

However, the present disclosure is not limited thereto. The threshold number of times may indicate other scenarios.

In the present disclosure, when the refresh unit 32 is accessed a threshold number of times, for example, 5,000,000 times, which is very high, the refresh unit 32 is refreshed. In addition, the refresh unit 32 can be refreshed in a variety of different ways, depending on different access circumstances of the refresh unit 32. As a result, the refresh operation is relatively versatile, as will be described and illustrated in detail with reference to FIGS. 4 to 7.

In some existing DRAMs, when a refresh unit of the DRAM is accessed, for example, 5,000,000 times, the refresh unit is refreshed in only a single way. For the purpose of discussion, taking the refresh unit 32 for instance, when the refresh unit 32 is accessed, for example, 5,000,000 times, the refresh unit 32 is refreshed in the single way that all of the memory rows 33 to 37 are refreshed according to the same refresh rate. As a result, such DRAM is relatively not versatile.

Figure 4:
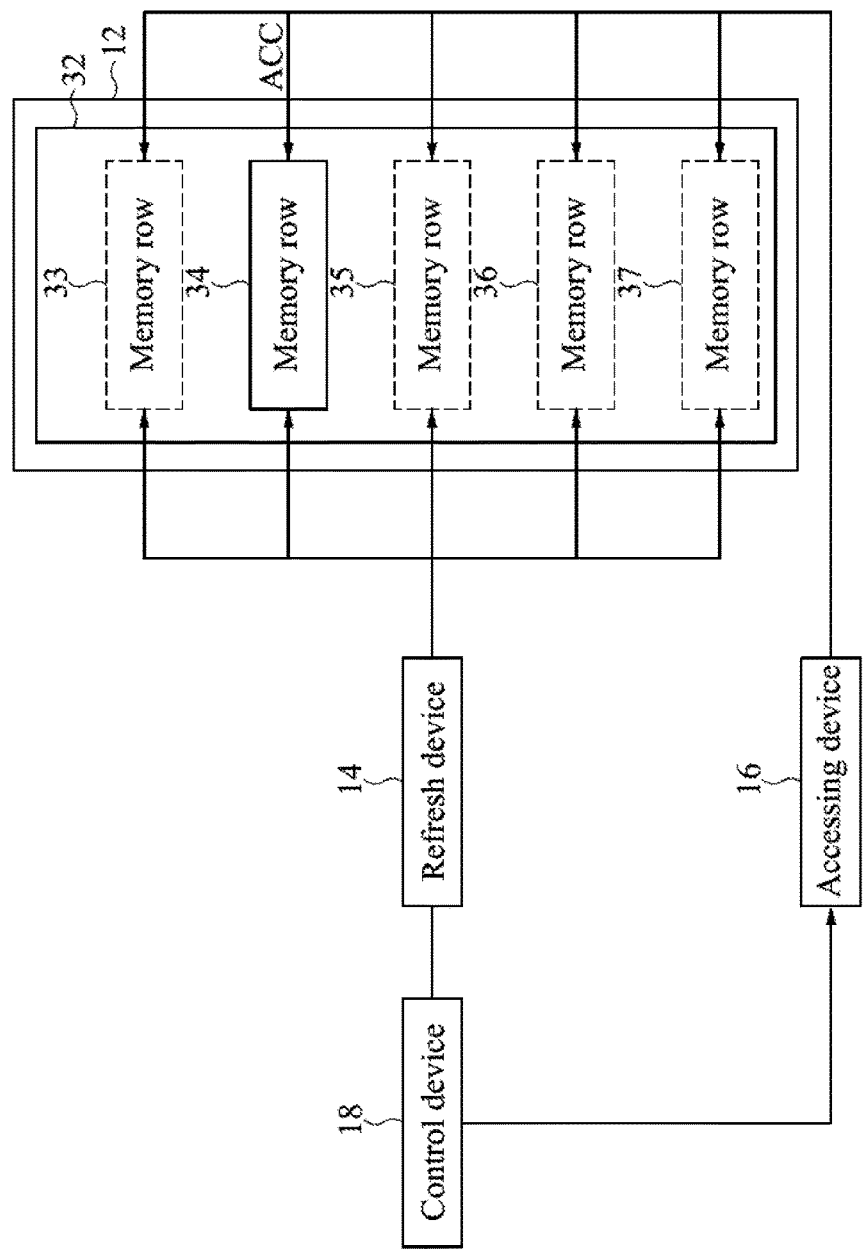
FIG. 4 is a schematic diagram illustrating an access operation of a first scenario of operating the DRAM shown in FIG. 3, in accordance with some embodiments of the present disclosure.

FIG. 4 is a schematic diagram illustrating an access operation of a first scenario of operating the DRAM 10 shown in FIG. 3, in accordance with some embodiments of the present disclosure. Referring to FIG. 4, the accessing device 16 accesses the refresh unit 32 the threshold number of times within a self-refresh cycle.

The control device 18 determines whether a quantity of accessed memory rows of the refresh unit 32 is greater than a first threshold quantity. For the purpose of discussion, it is assumed that the first threshold quantity is 2. In the embodiment shown in FIG. 4, only the single memory row 34 is accessed. The control device 18 determines that the quantity of 1 is not greater than the first threshold quantity of 2.

Figure 5:
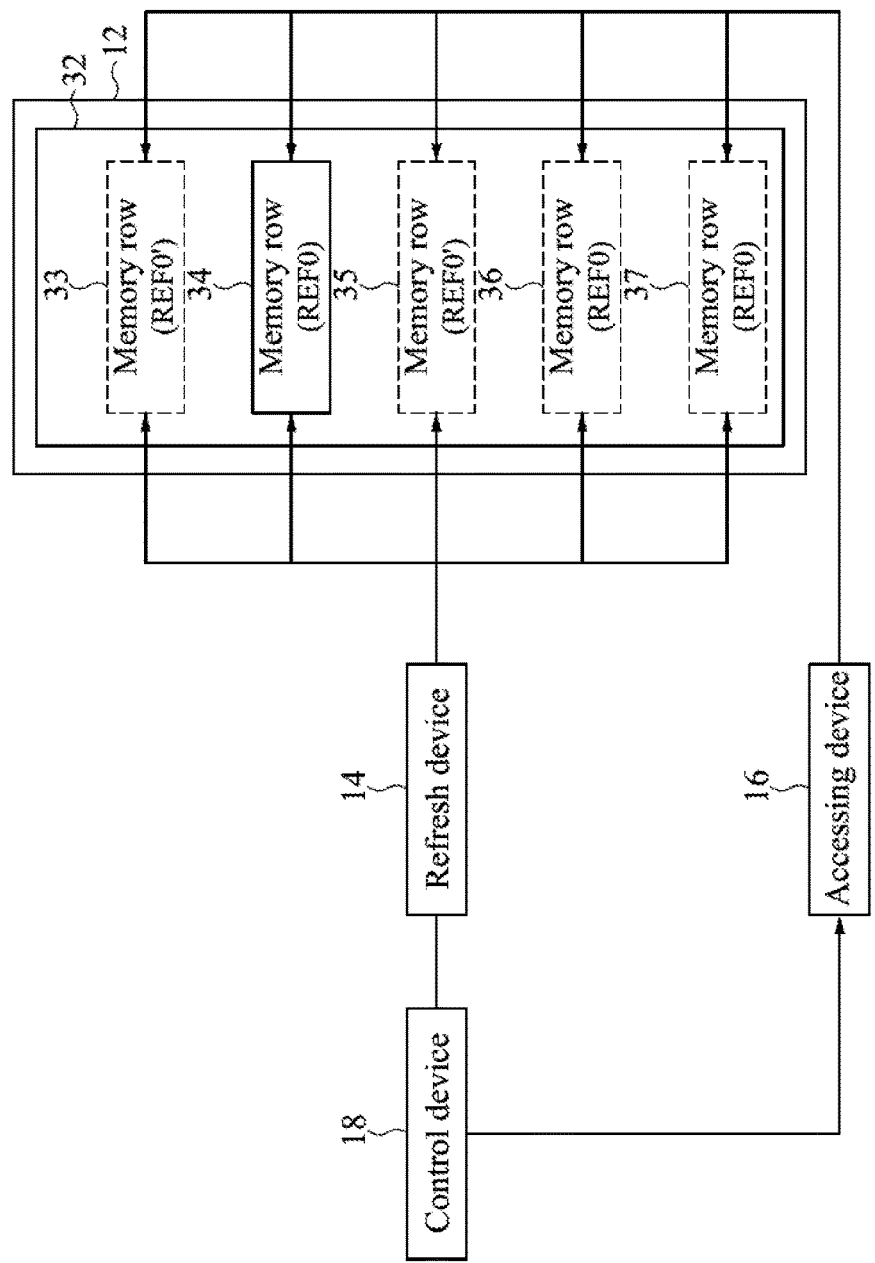
FIG. 5 is a schematic diagram illustrating a refresh operation of the first scenario of operating the DRAM shown in FIG. 3, in accordance with some embodiments of the present disclosure.

FIG. 5 is a schematic diagram illustrating a refresh operation of the first scenario of operating the DRAM 10 shown in FIG. 3, in accordance with some embodiments of the present disclosure. Referring to FIG. 5, the control device 18 identifies, from among the all of unaccessed memory rows 33, 35, 36 and 37, the neighbor memory rows 33 and 35. The neighbor memory rows 33 and 35 are two of all of the unaccessed memory rows 33, 35, 36 and 37, and are immediately adjacent to the accessed memory row 34.

The refresh device 14 refreshes the refresh unit 32 according to a first refresh rate REF0 except for the neighbor memory rows 33 and 35 in response to a first event, in which an access time of the refresh unit 32 reaches a threshold number of times and a quantity of accessed memory rows of the refresh unit 32 is not greater than the first threshold quantity. Moreover, the refresh device 14 refreshes the neighbor memory rows 33 and 35 according to a second refresh rate REF0' greater than the first refresh rate REF0 in response to the first event.

Since access times of, for example, 5,000,000 times are concentrated on the single memory row 34, a row hammer effect on the memory row 34 is relatively serious. That is, a data of the neighbor memory rows 33 and 35 is relatively subject to flip compared to other non-neighbor memory rows 36 and 37. In the present embodiment, the memory rows 33 and 35 are refreshed according to the relatively high second refresh rate REF0'. As a result, such adverse effect on the neighbor memory rows 33 and 35 may be alleviated, or eliminated. Moreover, only the neighbor memory rows 33 and 35, instead of the all of unaccessed memory rows 33, 35, 36 and 37, are refreshed according to the relatively high second refresh rate REF0'. As a result, the DRAM 10 is relatively power efficient.

In some existing DRAMs, when a refresh unit of the DRAM is accessed, for example, 5,000,000 times, all of its memory rows, including a memory row analogous to the neighbor memory row of the present disclosure, are refreshed according to the same refresh rate. In further detail, a data of the memory row is relatively subject to flip compared to other non-neighbor memory rows. However, a refresh rate of the memory row is not increased, and the memory row is refreshed still according to the same relatively low refresh rate according to which the other non-neighbor memory rows are refreshed. Hence, data-flip issue on the memory row is still relatively serious even though the memory row is refreshed. In response to the possible data flip, the existing DRAM may function abnormally and lack reliability.

Figure 6:
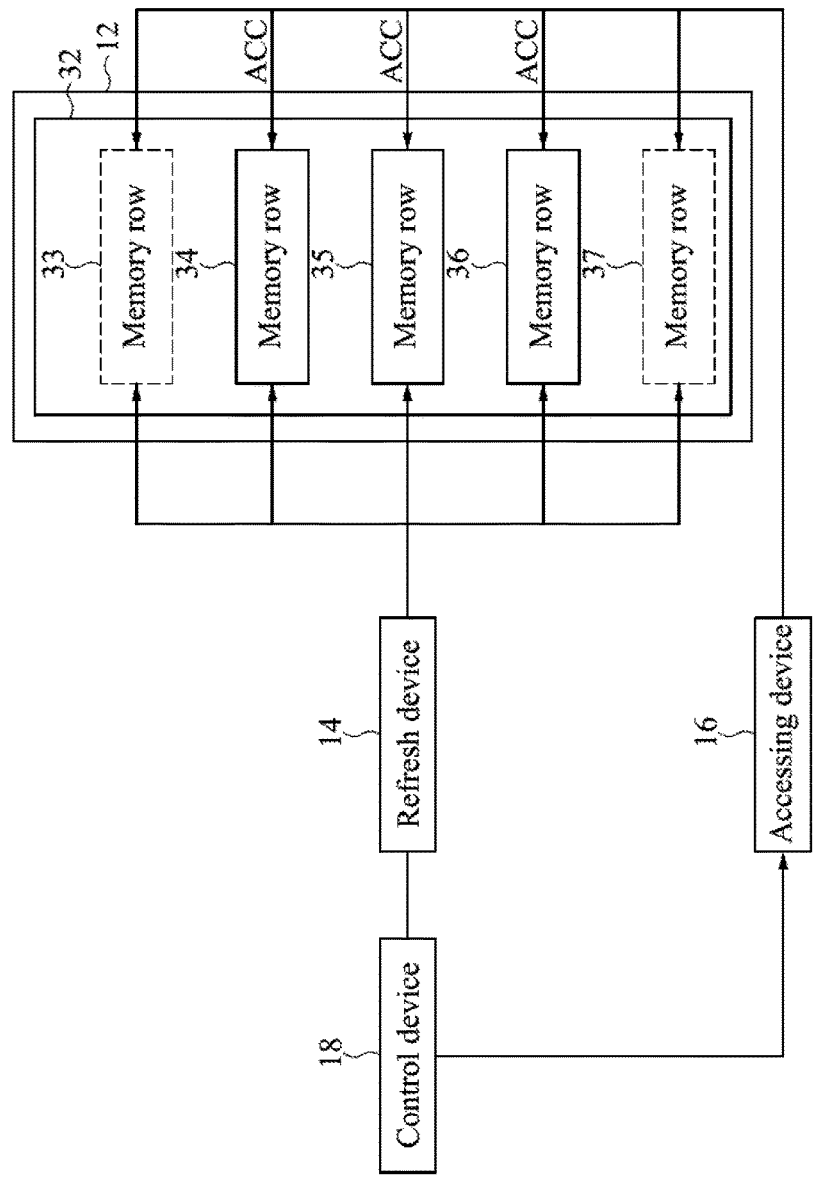
FIG. 6 is a schematic diagram illustrating an access operation of a second scenario of operating the DRAM shown in FIG. 3, in accordance with some embodiments of the present disclosure.

FIG. 6 is a schematic diagram illustrating an access operation of a second scenario of operating the DRAM 10 shown in FIG. 3, in accordance with some embodiments of the present disclosure. Referring to FIG. 6, the accessing device 16 accesses the refresh unit 32 the threshold number of times within a self-refresh cycle.

As discussed in the embodiment of FIG. 5, it is assumed that the first threshold quantity is 2. In the embodiment shown in FIG. 2, three memory rows 34, 35 and 36 are accessed. The control device 18 determines that the quantity of 3 is greater than the first threshold quantity of 2.

Figure 7:
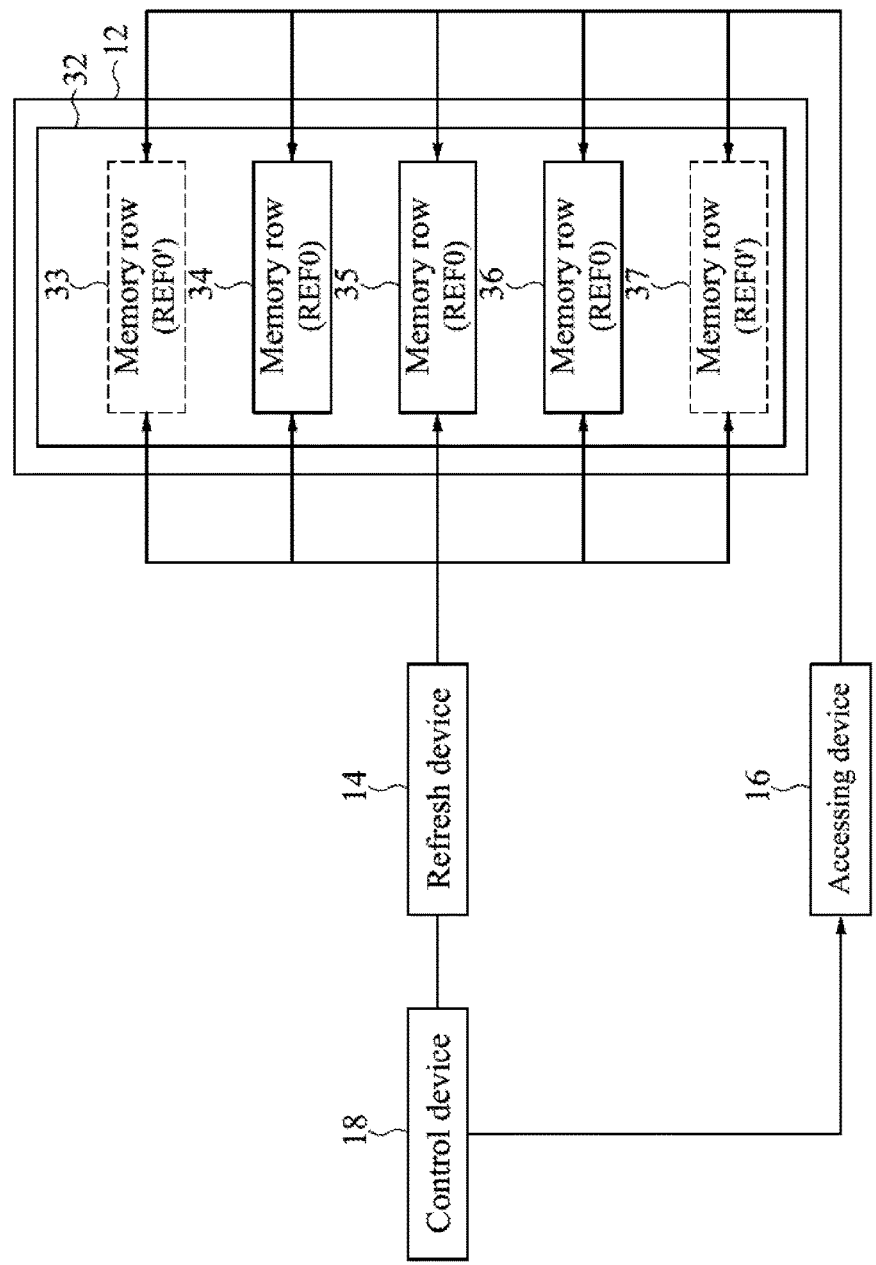
FIG. 7 is a schematic diagram illustrating a refresh operation of the second scenario of operating the DRAM shown in FIG. 3, in accordance with some embodiments of the present disclosure.

FIG. 7 is a schematic diagram illustrating a refresh operation of the second scenario of operating the DRAM 10 shown in FIG. 3, in accordance with some embodiments of the present disclosure. Referring to FIG. 7, the refresh device 14 refreshes the refresh unit 32 according to the first refresh rate REF0 except for all of the unaccessed memory rows 33 and 37 in response to a second event, in which an access time of the refresh unit 32 reaches the threshold number of times and the quantity of accessed memory rows of the refresh unit 32 is greater than the first threshold quantity. Moreover, the refresh device 14 refreshes the all of unaccessed memory rows 33 and 37 according to the second refresh rate REF0' in response to the second event.

A circumstance in which a quantity of accessed memory rows of the refresh unit 32 is greater than a threshold quantity means that the unaccessed memory rows 33 and 37 comprise a minority of the all of the memory rows 33 to 37, and the accessed memory rows 34, 35 and 36 comprise a majority of the all of the memory rows 33 to 37.

The number of times of identifying neighbor memory rows is positively correlated to the quantity of accessed memory rows. The number of times of the identification of the neighbor memory rows increases as the quantity of accessed memory rows increases.

In the second event, the accessed memory rows comprise the majority of the all of memory rows. The control device 18 does not identify neighbor memory rows in response to the second event. As a result, the DRAM 10 has relatively greater computational efficiency.

Figure 8:
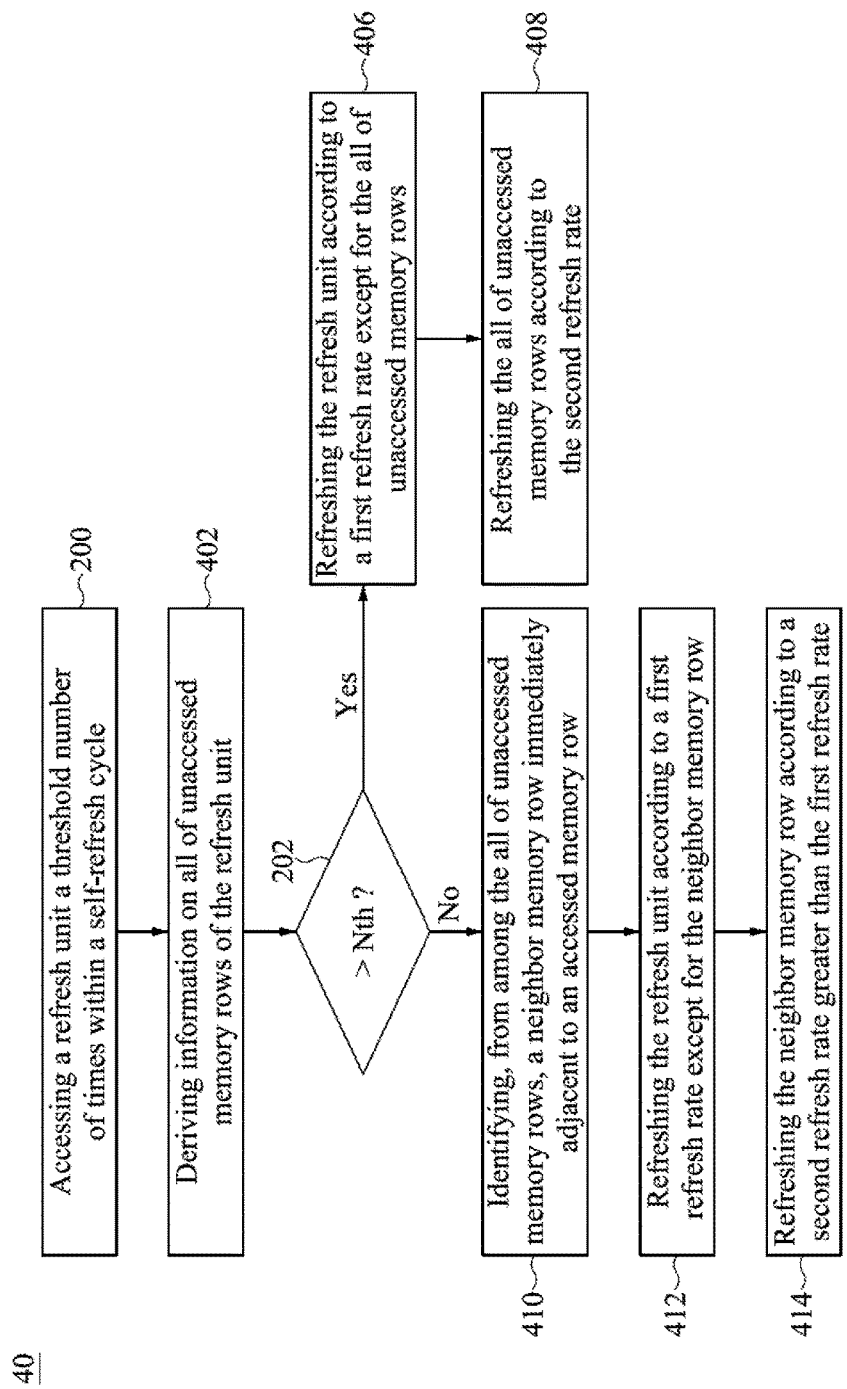
FIG. 8 is a flow diagram of a method of operating a DRAM, in accordance with some embodiments of the present disclosure.

FIG. 8 is a flow diagram of a method 40 of operating a DRAM, in accordance with some embodiments of the present disclosure. Referring to FIG. 8, the method 40 is similar to the method 20 described and illustrated with reference to FIG. 2 except that, for example, the method 40 includes operations 402, 406, 408, 410, 412 and 414.

In operation 402, information on all of unaccessed memory rows of the refresh unit is derived.

Subsequent to operation 202, if negative, the method 40 proceeds to operation 410. In operation 410, from among the all of unaccessed memory rows, a neighbor memory row is identified, wherein the neighbor memory row is immediately adjacent to an accessed memory row. The method 40 proceeds to operation 412, in which the refresh unit is refreshed according to a first refresh rate except for the neighbor memory row. The method 40 continues with operation 414, in which the neighbor memory row is refreshed according to a second refresh rate greater than the first refresh rate. If affirmative, the method 40 proceeds to operation 406. In operation 406, the refresh unit is refreshed according to a first refresh rate except for the all of unaccessed memory rows. The method 40 proceeds to operation 408, in which the all of unaccessed memory rows is refreshed according to the second refresh rate.

The method 40 is merely an example, and is not intended to limit the present disclosure beyond what is explicitly recited in the claims. Additional operations can be provided before, during, and after the method 40, and some operations described can be replaced, eliminated, or moved around for additional embodiments of the method.

In the present embodiment, when the refresh unit is accessed the threshold number of times, for example, 5,000,000 times, which is very high, the refresh unit is refreshed.

In addition, the refresh unit can be refreshed in a variety of different ways according to different access circumstances of the refresh unit. As a result, the refresh operation is relatively versatile.

In some existing approaches, when the refresh unit is accessed, for example, 5,000,000 times, the refresh unit is refreshed in only a single way. As a result, such approach is relatively not versatile.

Figure 9:
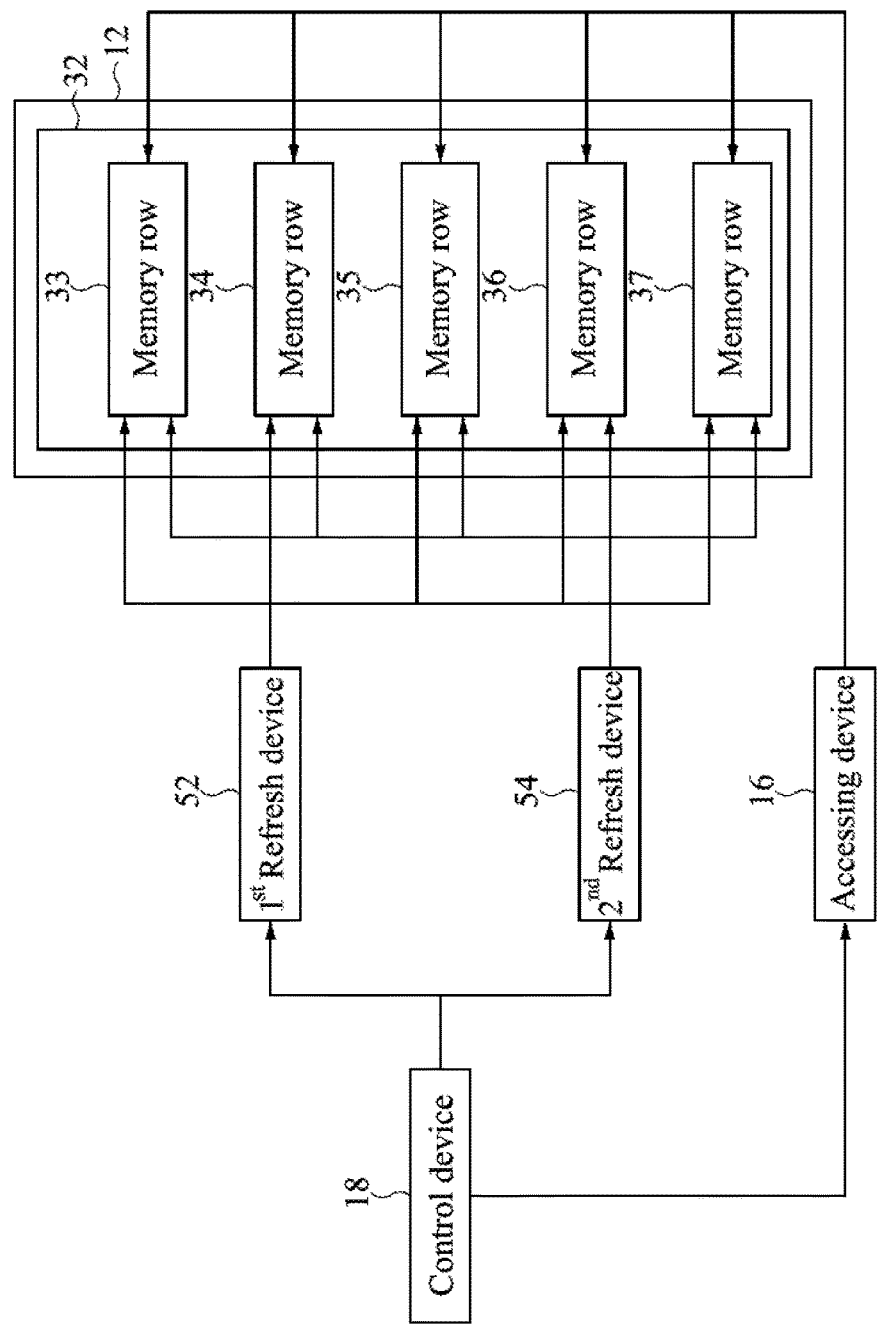
FIG. 9 is a schematic diagram of another DRAM including the refresh unit shown in FIG. 1, in accordance with some embodiments of the present disclosure.

FIG. 9 is a schematic diagram of another DRAM 50 including the refresh unit 32 shown in FIG. 1, in accordance with some embodiments of the present disclosure. Referring to FIG. 9, the DRAM 50 is similar to the DRAM 10 described and illustrated with reference to FIG. 3 except that, for example, the DRAM 50 includes a first refresh device 52 and a second refresh device 54.

The first refresh device 52 functions to refresh the refresh unit 32, in particular, all of the memory rows 33 to 37, according to a first refresh rate REF1.

The second refresh device 54 functions to be activated in response to an event, in which an access time of the refresh unit 32 reaches a threshold number of times within a self-refresh cycle, and the second refresh device 54 refreshes the refresh unit 32 according to a second refresh rate REF2 when being activated. In further detail, the second refresh device 54 refreshes a portion of the memory rows of the refresh unit 32 according to the second refresh rate REF2 in a variety of different ways according to different access circumstances of the refresh unit 32, as will be described in detail with reference to FIGS. 10, 11, and 13 to 15.

In some embodiments, the control device 18 functions to generate the access time of the refresh unit 32 by counting how many times the accessing device 16 accesses the refresh unit 32, control the second refresh device 54 to refresh all of unaccessed memory rows when the count indicates a second event, and control the second refresh device 54 to refresh the neighbor memory row when the count indicates a first event.

With the second refresh device 54, a refresh operation performed on the refresh unit 32 is relatively versatile.

Figure 10:
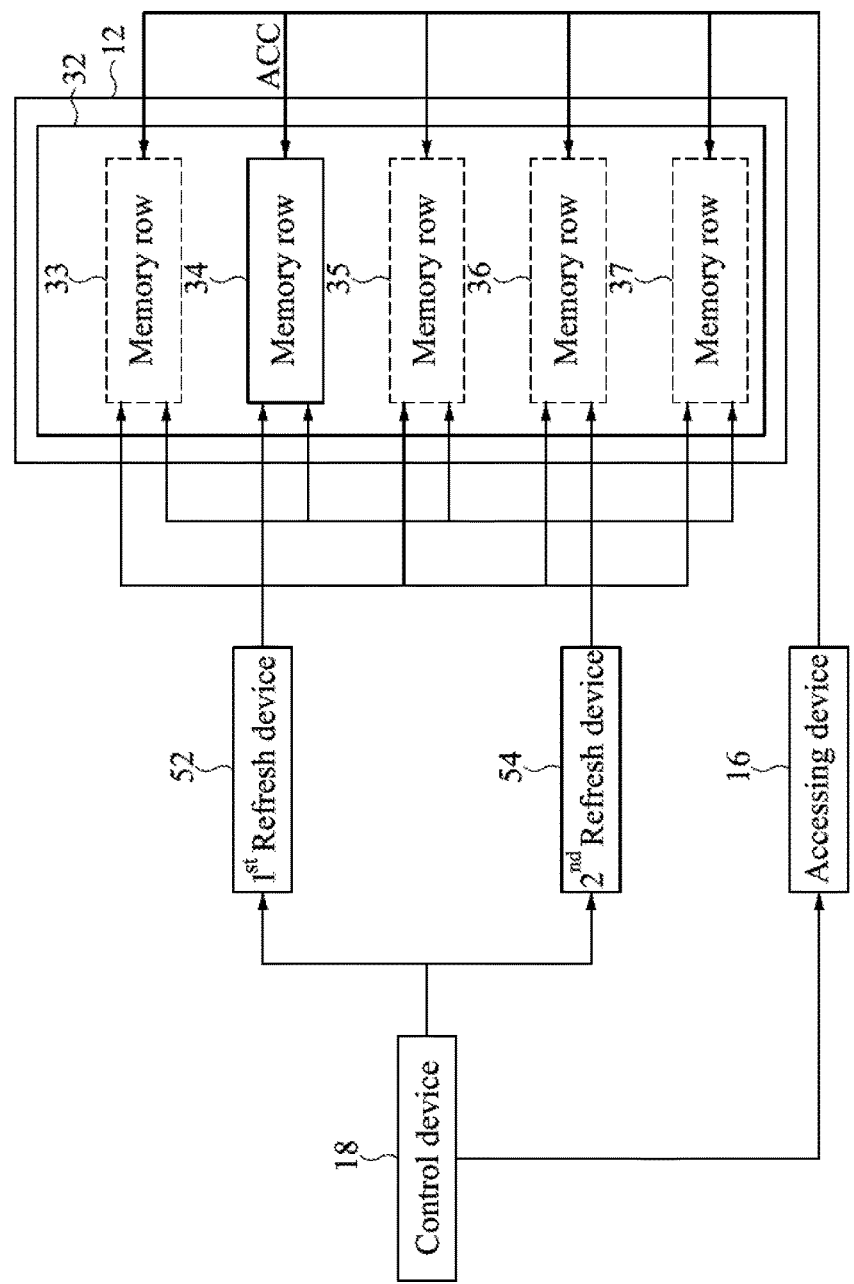
FIG. 10 is a schematic diagram illustrating an access operation of a first scenario of operating the DRAM shown in FIG. 9, in accordance with some embodiments of the present disclosure.

FIG. 10 is a schematic diagram illustrating an access operation of a first scenario of operating the DRAM 50 shown in FIG. 9, in accordance with some embodiments of the present disclosure. Referring to FIG. 10, the accessing device 16 accesses the refresh unit 32 the threshold number of times within a self-refresh cycle.

The control device 18 determines whether a quantity of accessed memory rows of the refresh unit 32 is greater than a first threshold quantity. In the embodiment shown in FIG. 10, only the single memory row 34 is accessed. The control device 18 determines that the quantity of 1 is not greater than the first threshold quantity of 2.

Figure 11:
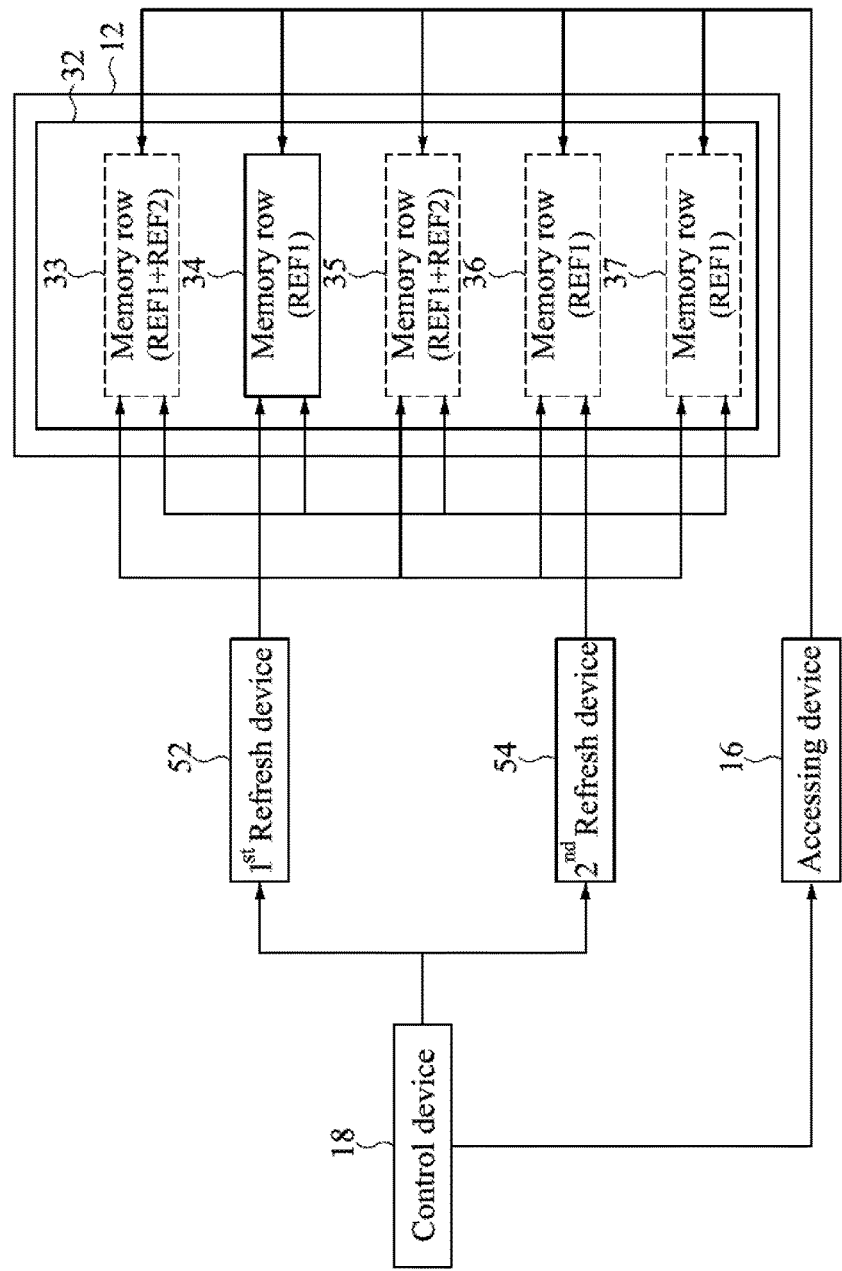
FIG. 11 is a schematic diagram illustrating a refresh operation of the first scenario of operating the DRAM shown in FIG. 9, in accordance with some embodiments of the present disclosure.

FIG. 11 is a schematic diagram illustrating a refresh operation of the first scenario of operating the DRAM 50 shown in FIG. 9, in accordance with some embodiments of the present disclosure. Referring to FIG. 11, the control device 18 identifies, from among the all of unaccessed memory rows 33, 35, 36 and 37, the neighbor memory rows 33 and 35.

The first refresh device 52 refreshes all of the memory rows 33 to 37 of the refresh unit 32 according to the first refresh rate REF1.

The second refresh device 54 refreshes the neighbor memory rows 33 and 35 according to the second refresh rate REF2 in response to a first event, in which the access time of the refresh unit 32 reaches the threshold number of times within the self-refresh cycle and a quantity of accessed memory rows of the refresh unit 32 is not greater than the first threshold quantity. The refresh operation performed by the second refresh device 54 is independent from that by the first refresh device 52.

Figure 12:
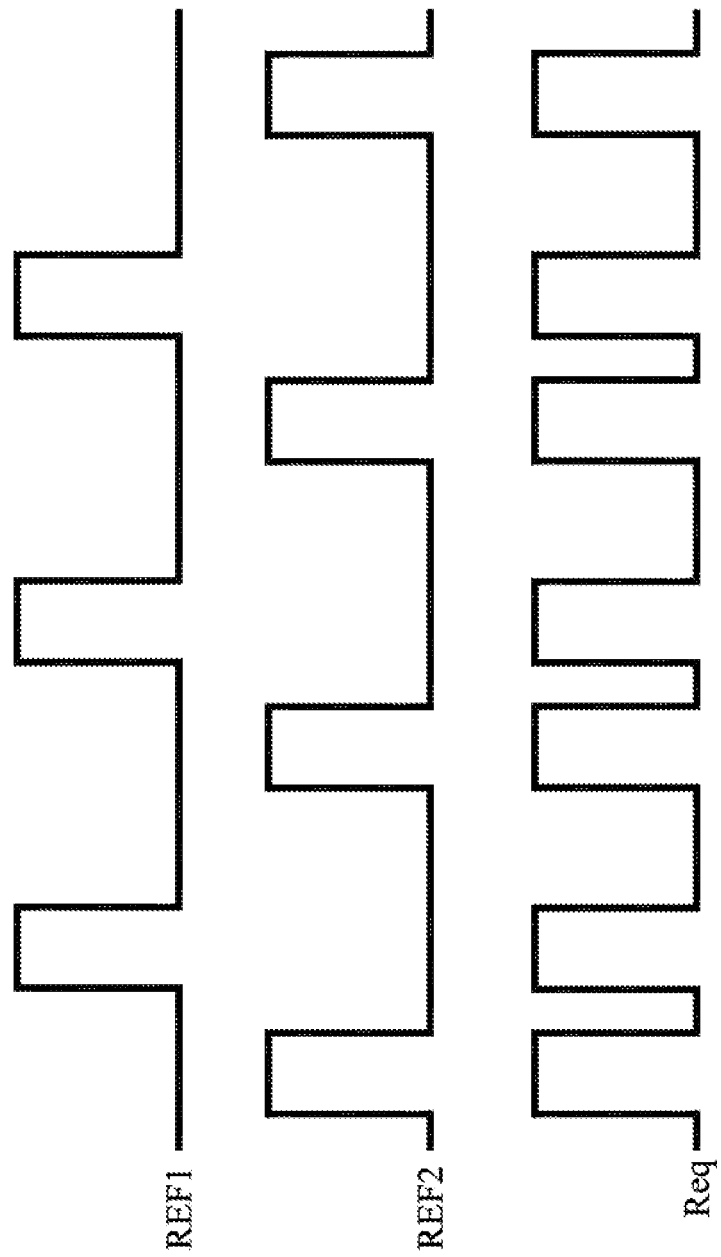
FIG. 12 is a timing diagram of illustrative refresh rates, in accordance with some embodiments.

An equivalent refresh rate (REF1+REF2) applied to the neighbor memory rows 33 and 35 is greater than the first refresh rate REF1, as shown in FIG. 12. As discussed in the description of FIG. 5, an adverse effect of data stored in the memory rows 33 and 35 being subject to be flipped may be alleviated or eliminated.

FIG. 12 is a timing diagram of illustrative refresh rates, in accordance with some embodiments. Referring to FIG. 12, a top waveform represents the first refresh rate REF1; a middle waveform represents the second refresh rate REF2; and a bottom waveform represents the equivalent refresh rate Req (or REF1+REF2).

As can be observed from FIG. 12, an active time of a duty cycle associated with the first refresh rate REF1 and an active time of a duty cycle associated with the second refresh rate REF2 are alternately exhibited. As a result, the equivalent refresh rate Req is greater than the first refresh rate REF1.

Figure 13:
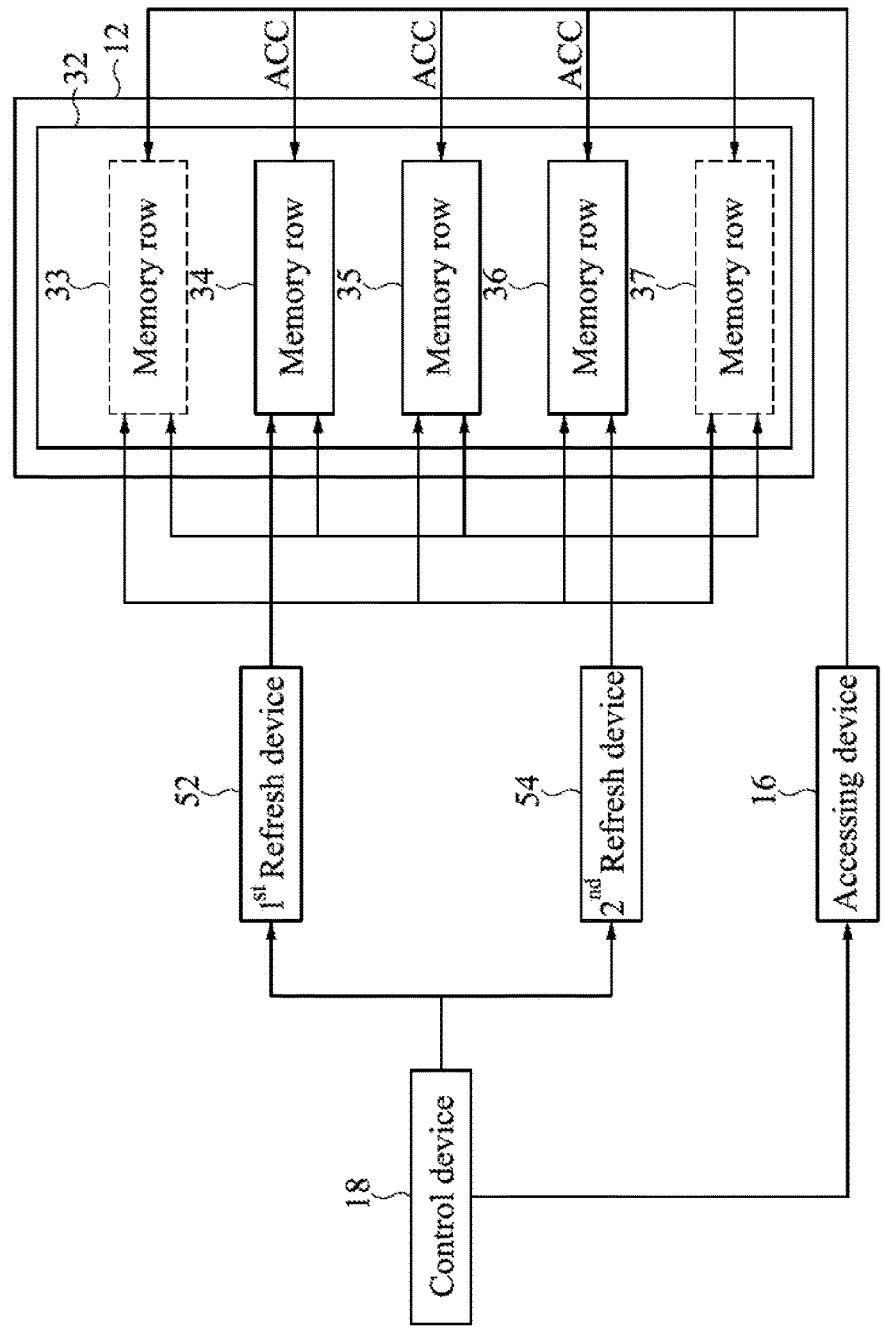
FIG. 13 is a schematic diagram illustrating an access operation of a second scenario of operating the DRAM shown in FIG. 9, in accordance with some embodiments of the present disclosure.

FIG. 13 is a schematic diagram illustrating an access operation of a second scenario of operating the DRAM 50 shown in FIG. 9, in accordance with some embodiments of the present disclosure. Referring to FIG. 13, the accessing device 16 accesses the refresh unit 32 the threshold number of times within a self-refresh cycle.

As discussed in the embodiment of FIG. 5, it is assumed that the first threshold quantity is 2. In the embodiment shown in FIG. 13, three memory rows 34, 35 and 36 are accessed. The control device 18 determines that the quantity of 3 is greater than the first threshold quantity of 2.

Figure 14:
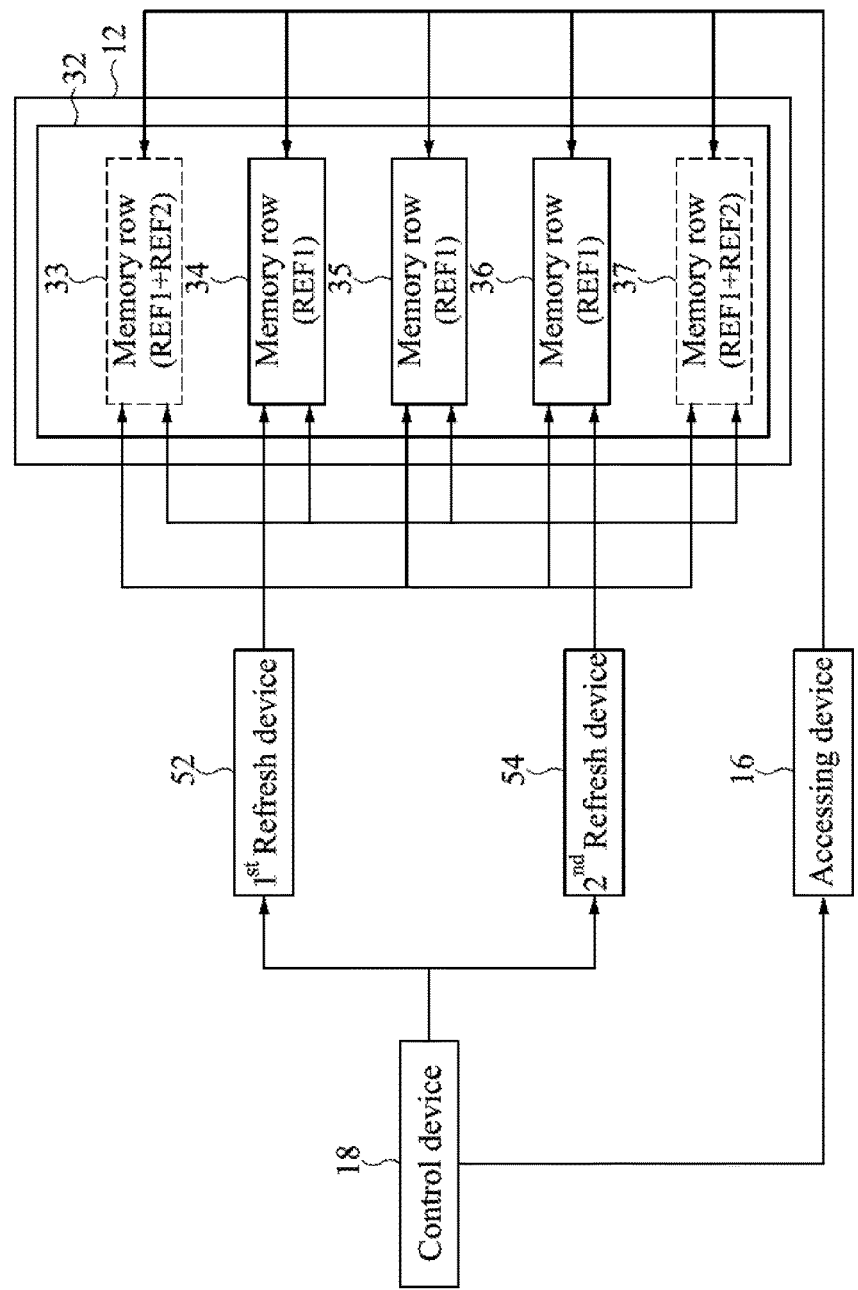
FIG. 14 is a schematic diagram illustrating a refresh operation of the second scenario of operating the DRAM shown in FIG. 9, in accordance with some embodiments of the present disclosure.

FIG. 14 is a schematic diagram illustrating a refresh operation of the second scenario of operating the DRAM 50 shown in FIG. 9, in accordance with some embodiments of the present disclosure. Referring to FIG. 14, the first refresh device 52 refreshes all of the memory rows 33 to 37 of the refresh unit 32 according to the first refresh rate REF1.

Moreover, the second refresh device 54 refreshes the all of unaccessed memory rows 33 and 37 according to the second refresh rate REF2 in response to a second event, in which the access time of the refresh unit 32 reaches a threshold number of times within the self-refresh cycle and the quantity of accessed memory rows is greater than the threshold quantity.

As previously discussed, the control device 18 does not perform an identification operation to identify neighbor memory rows in response to the second event. As a result, the DRAM 10 has relatively greater computational efficiency.

Figure 15:
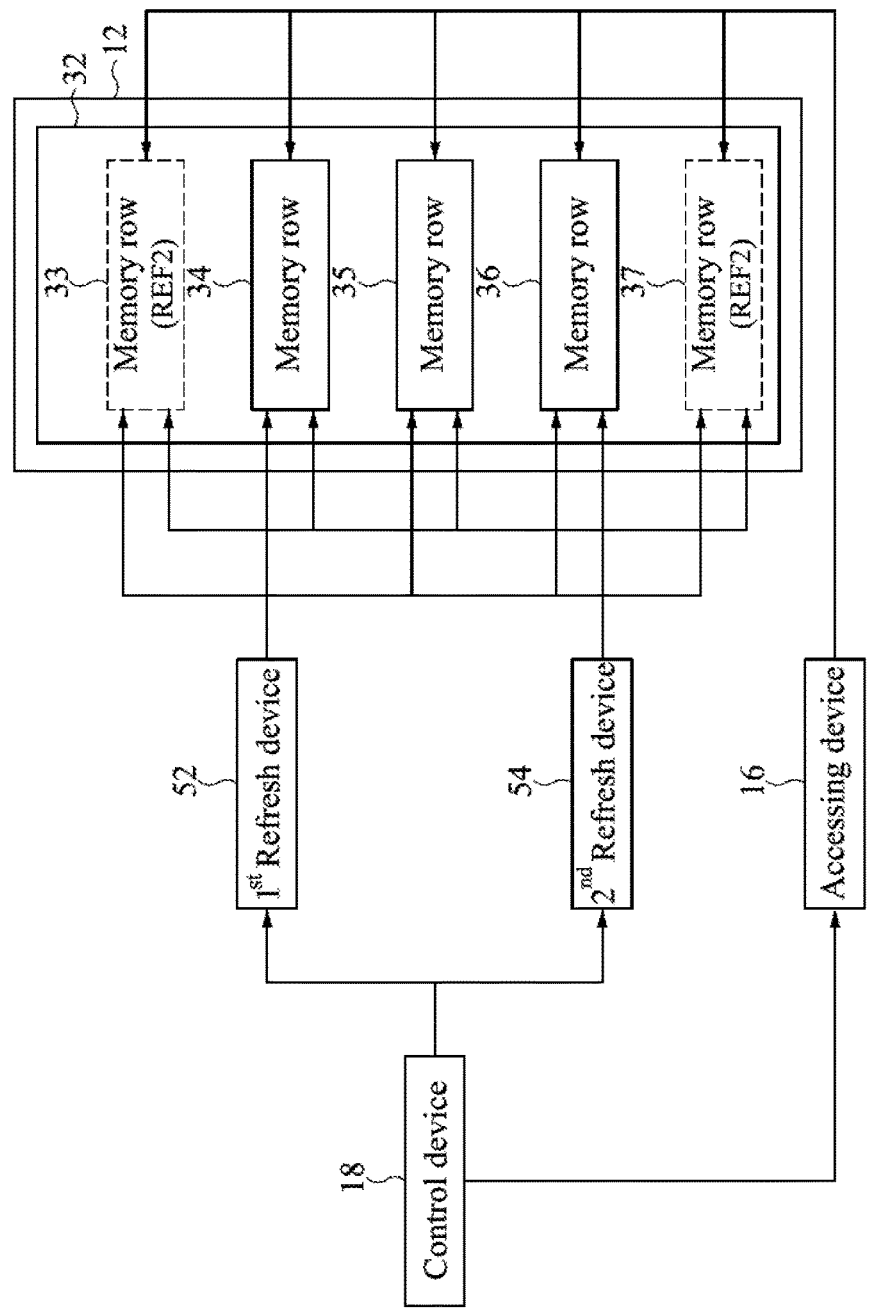
FIG. 15 is a schematic diagram illustrating another refresh operation of the second scenario of operating the DRAM shown in FIG. 9, in accordance with some embodiments of the present disclosure.

FIG. 15 is a schematic diagram illustrating another refresh operation of the second scenario of operating the DRAM 50 shown in FIG. 9, in accordance with some embodiments of the present disclosure. Referring to FIG. 15, the first refresh device 52 does not refresh the fresh unit 32 in response to a third event, in which the access time of the refresh unit 32 reaches the threshold number of times within the self-refresh cycle and the quantity of accessed memory rows is equal to or greater than a second threshold quantity which is greater than the first threshold quantity. For convenience of discussion, assume that the first threshold quantity is 2, and the second threshold quantity is 3. In the embodiment shown in FIG. 13, three memory rows 34, 35 and 36 are accessed. The control device 18 determines that the quantity of 3 is greater than the first threshold quantity of 2 and is equal to the second threshold quantity of 3. Hence, the control device 18 controls the first refresh device 52, such that the first refresh device 52 does not refresh the refresh unit 32.

An access operation includes a similar operation with a refresh operation. For example, the access operation includes a read operation. When the read operation is performed, a charge is read from the memory cell 140, and the same charge is immediately written back to the memory cell 140. Therefore, when a memory row is accessed many times, the memory row can be deemed as being refreshed many times. As such, data stored in the memory row is relatively reliable.

Since the memory rows 34 to 36, which comprise a majority of the all of unaccessed memory rows 33 to 37, are accessed many times, data stored in the memory rows 34 to 36 is reliable even though the first refresh device 52 does not refresh the fresh unit 32, in particular, the memory rows 34 to 36. Since the first refresh device 52 does not perform the refresh operation, the DRAM 50 is relatively power efficient.

Moreover, the memory rows 33 and 37 are still refreshed by the second refresh device 54. As a result, a risk of a flip of data, resulting from a row hammer effect, on the memory rows 33 and 37 can still be alleviated or eliminated.

Figure 16:
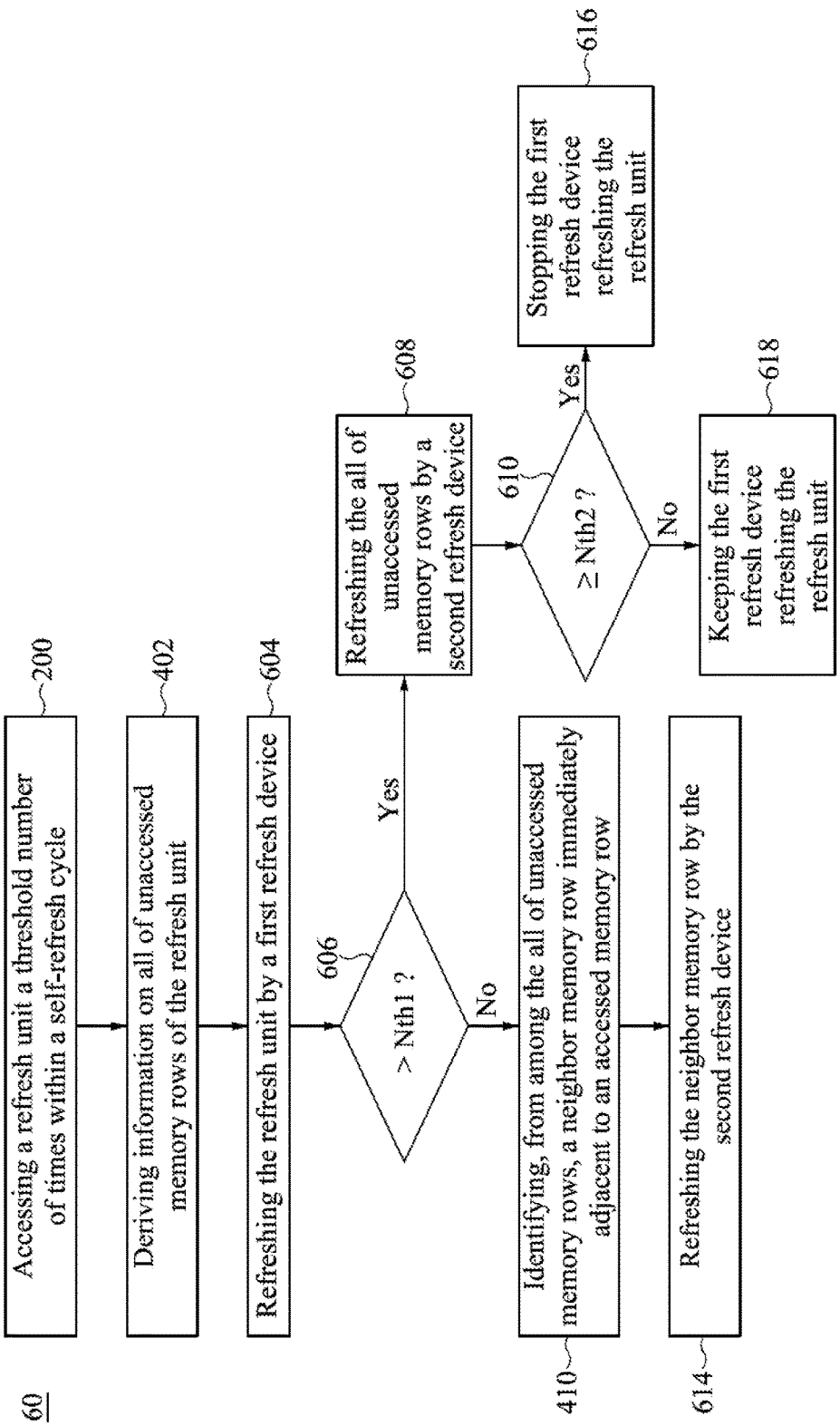
FIG. 16 is a flow diagram of a method of operating a DRAM, in accordance with some embodiments of the present disclosure.

FIG. 16 is a flow diagram of a method 60 of operating a DRAM, in accordance with some embodiments of the present disclosure. Referring to FIG. 16, the method 60 is similar to the method 40 described and illustrated with reference to FIG. 8 except that, for example, the method 60 includes operations 604, 606, 608, 610, 614, 616 and 618.

In operation 604, the refresh unit is refreshed by a first refresh device with a first refresh rate.

Operation 606 is similar to operation 202 described and illustrated with reference to FIG. 8 except that, for example, the threshold quantity is renamed as a first threshold quantity in the embodiment of FIG. 16.

In operation 606, if negative, the method 60 proceeds to operation 614. In operation 614, the neighbor memory row is refreshed by the second refresh device with a second refresh rate. If affirmative, the method 60 proceeds to operation 608. In operation 608, the all of unaccessed memory rows are refreshed by the second refresh device.

The method 60 proceeds to operation 610, in which it is determined whether the access time of the refresh unit is equal to or greater than a second threshold quantity which is greater than the first threshold quantity. If affirmative, the method 60 proceeds to operation 616. In operation 616, the first refresh device is stopped refreshing the refresh unit. If negative, the method 60 proceeds to operation 618. In operation 618, the first refresh device keeps refreshing the refresh unit.

The method 60 is merely an example, and is not intended to limit the present disclosure beyond what is explicitly recited in the claims. Additional operations can be provided before, during, and after the method 60, and some operations described can be replaced, eliminated, or moved around for additional embodiments of the method.

In the present disclosure, when the refresh unit 32 is accessed the threshold number of times, for example, 5,000,000 times, which is very high, the refresh unit 32 can be refreshed in a variety of different ways according to different access circumstances of the refresh unit 32. As a result, the refresh operation is relatively versatile.

In some existing DRAMs, when a refresh unit of the DRAM is accessed, for example, 5,000,000 times, the refresh unit is refreshed in only a single way. For the purpose of discussion, taking the refresh unit 32 for instance, when the refresh unit 32 is accessed, for example, 5,000,000 times, the refresh unit 32 is refreshed in the same way that all of the memory rows 33 to 37 are refreshed according to the same refresh rate. As a result, such DRAM is relatively not versatile.

One aspect of the present disclosure provides a DRAM. The DRAM includes a refresh unit, an accessing device and a refresh device. The refresh unit has a plurality of memory rows. The accessing device is configured to access the memory rows. The refresh device is configured to refresh the refresh unit in a first manner in response to a first event, in which a quantity of accessed memory rows of the refresh unit is not greater than a threshold quantity. The refresh device is configured to refresh the refresh unit in a second manner in response to a second event, in which the quantity of accessed memory rows of the refresh unit is greater than the threshold quantity.

Another aspect of the present disclosure provides a DRAM. The DRAM includes a refresh unit, an accessing device, a first refresh device and a second refresh device. The accessing device is configured to access the refresh unit having a plurality of memory rows. The first refresh device is configured to refresh the refresh unit. The second refresh device is configured to refresh a neighbor memory row of the refresh unit in response to a first event, in which an access time of the refresh unit reaches a threshold number of times within a self-refresh cycle and a quantity of accessed memory rows of the refresh unit is not greater than a first threshold quantity, wherein the neighbor memory row is one of all of unaccessed memory rows of the refresh unit and immediately adjacent to an accessed memory row of the refresh unit.

The accessing device is configured to access the refresh unit a threshold number of times. The first refresh device is configured to refresh the refresh unit according to a first refresh rate. The second refresh device is configured to refresh a neighbor memory row of the refresh unit according to a second refresh rate in response to a first event, in which a quantity of accessed memory rows of the refresh unit is not greater than a threshold quantity. The neighbor memory row is one of all of unaccessed memory rows of the refresh unit and is immediately adjacent to an accessed memory row of the refresh unit.

Another aspect of the present disclosure provides a DRAM. The DRAM includes a refresh unit, an accessing device, a first refresh device and a second refresh device. The accessing device is configured to access the refresh unit having a plurality of memory rows. The first refresh device is configured to refresh the refresh unit according to a first refresh rate. The second refresh device is configured to be activated in response to an event in which an access time of the refresh unit reaches a threshold number of times within a self-refresh cycle, and to refresh unaccessed memory rows of the refresh unit according to a second refresh rate when being activated.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A dynamic random access memory (DRAM), comprising:
   a refresh unit having a plurality of memory rows;
   an accessing device configured to access the memory rows; and
   a refresh device configured to refresh the refresh unit in a first manner in response to a first event, in which an access time of the refresh unit reaches a threshold number of times within a self-refresh cycle and a quantity of accessed memory rows of the refresh unit is not greater than a threshold quantity, and in a second manner in response to a second event, in which the access time of the refresh unit reaches the threshold number of times within the self-refresh cycle and the quantity of accessed memory rows of the refresh unit is greater than the threshold quantity.

2. The DRAM of claim 1, wherein the refresh device is configured to, in response to the first event, refresh the refresh unit according to a first refresh rate, except for a neighbor memory row of the refresh unit, wherein the neighbor memory row is one of all of unaccessed memory rows of the refresh unit, and the neighbor memory row is immediately adjacent to an accessed memory row of the refresh unit.

3. The DRAM of claim 2, wherein the refresh device is configured to, in response to the first event, refresh the neighbor memory row according to a second refresh rate greater than the first refresh rate.

4. The DRAM of claim 3, further comprising:
   a control device configured to identify, from among the all of unaccessed memory rows, the neighbor memory row.

5. The DRAM of claim 1, wherein the refresh device is configured to, in response to the second event, refresh the refresh unit according to a first refresh rate, except for all of unaccessed memory rows.

6. The DRAM of claim 5, wherein the refresh device is configured to, in response to the second event, refresh the all of unaccessed memory rows according to a second refresh rate greater than the first refresh rate.

7. A dynamic random access memory (DRAM), comprising:
   a refresh unit;
   an accessing device configured to access the refresh unit having a plurality of memory rows;
   a first refresh device configured to refresh the memory rows; and
   a second refresh device configured to refresh a neighbor memory row in response to a first event, in which an access time of the refresh unit reaches a threshold number of times within a self-refresh cycle and a quantity of accessed memory rows of the refresh unit is not greater than a first threshold quantity,
   wherein the neighbor memory row is one of all of unaccessed memory rows of the refresh unit and immediately adjacent to an accessed memory row of the refresh unit.

8. The DRAM of claim 7, further comprising:
   a control device configured to identify, from among the all of unaccessed memory rows, the neighbor memory row.

9. The DRAM of claim 8, wherein the second refresh device is configured to refresh the all of unaccessed memory rows in response to a second event, in which the access time of the refresh unit reaches the threshold number of times within the self-refresh cycle and the quantity of accessed memory rows is greater than the first threshold quantity.

10. The DRAM of claim 9, wherein the first refresh device is configured to not refresh the refresh unit within the self-refresh cycle in response to a third event, in which the access time of the refresh unit reaches the threshold number of times within the self-refresh cycle and the quantity of accessed memory rows is equal to or greater than a second threshold quantity which is greater than the first threshold quantity.

11. The DRAM of claim 9, further comprising:
    a controller configured to generate the access time of the refresh unit by counting how many times the accessing device accesses the refresh unit, control the second refresh device to refresh the all of unaccessed memory rows when the count indicates the second event, and control the second refresh device to refresh the neighbor memory row when the count indicates the first event.

12. A dynamic random access memory (DRAM), comprising:
    a refresh unit;
    an accessing device configured to access the refresh unit having a plurality of memory rows;
    a first refresh device configured to refresh the memory rows according to a first refresh rate; and
    a second refresh device configured to be activated in response to an event in which an access time of the refresh unit reaches a threshold number of times within a self-refresh cycle, and to refresh unaccessed memory rows of the refresh unit according to a second refresh rate when being activated;
    wherein the second refresh device is further configured to refresh a neighbor memory row in response to a first event, in which a quantity of accessed memory rows of the refresh unit is not greater than a first threshold quantity; and
    wherein the neighbor memory row is one of all of unaccessed memory rows of the refresh unit, and the neighbor memory row is immediately adjacent to an accessed memory row of the refresh unit.

13. The DRAM of claim 12, wherein the second refresh device is activated,
    wherein the second refresh device is configured to refresh the all of unaccessed memory rows in response to a second event, in which the quantity of accessed memory rows is greater than a first threshold quantity.

14. The DRAM of claim 13, wherein the first refresh device is configured to not refresh the refresh unit within the self-refresh cycle in response to a third event, in which the quantity of accessed memory rows is equal to or greater than a second threshold quantity which is greater than the first threshold quantity.

* * * * *